United States Patent [19]
Hong et al.

[11] Patent Number: 5,429,976
[45] Date of Patent: Jul. 4, 1995

[54] SELF-ALIGNED METHOD FOR FORMING POLYSILICON WORD LINES ON TOP OF GATE ELECTRODES TO INCREASE CAPACITANCE OF A STACKED CAPACITOR IN A DRAM CELL

[75] Inventors: Gary Hong, Hsinchu; Cheng-Han Huang, Hsin-chu, both of Taiwan

[73] Assignee: United Microelectronics Corporation, Hsinchu, Taiwan

[21] Appl. No.: 158,787

[22] Filed: Dec. 1, 1993

[51] Int. Cl.6 ............... H01L 21/70; H01L 27/00
[52] U.S. Cl. ........................ 437/52; 437/60; 437/919
[58] Field of Search .................. 437/52, 919, 60

[56] References Cited

U.S. PATENT DOCUMENTS

| | | | |
|---|---|---|---|
| 5,047,817 | 9/1991 | Wakamiya et al. | 357/23.6 |
| 5,059,548 | 10/1991 | Kim | 437/52 |
| 5,071,783 | 12/1991 | Taguchi et al. | 437/52 |
| 5,096,847 | 5/1992 | Park et al. | 437/52 |
| 5,140,389 | 8/1992 | Kimura et al. | 357/23.6 |
| 5,142,300 | 9/1992 | Hamamoto et al. | 357/23.6 |
| 5,155,056 | 10/1992 | Jeong-Gyoo | 437/47 |
| 5,330,614 | 7/1994 | Ahn | 437/60 |

*Primary Examiner*—Olik Chaudhuri
*Assistant Examiner*—H. Jey Tsai
*Attorney, Agent, or Firm*—George O. Saile

[57] ABSTRACT

A method is described for forming a dynamic random access memory cell capacitor in which polysilicon word lines are formed in a self-aligned method on top of the gate electrodes of the memory cell wherein the polysilicon word lines act to increase the surface area and hence to increase the capacitance of the capacitor.

23 Claims, 3 Drawing Sheets

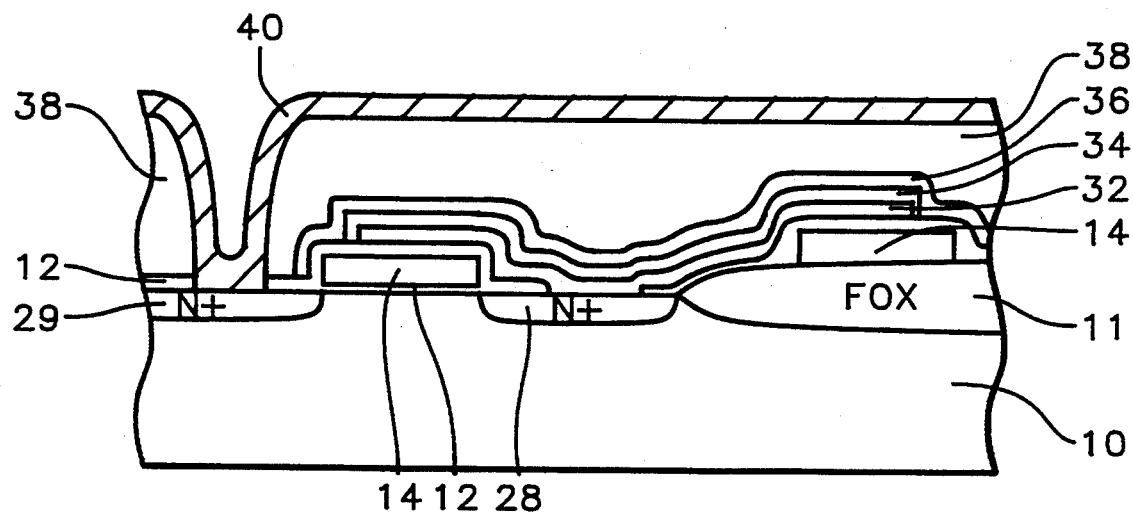
FIG. 1 *Prior Art*
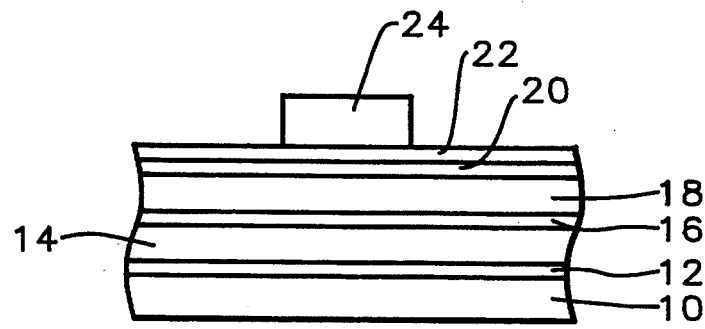
FIG. 2
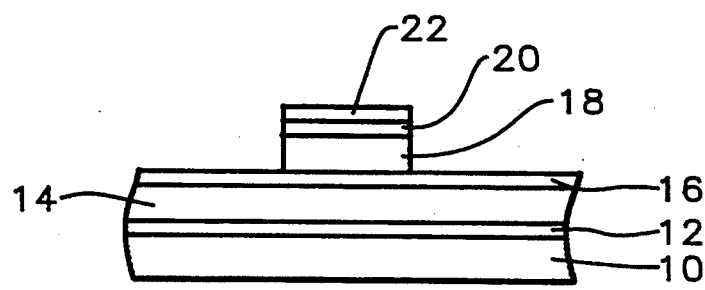
FIG. 3

SELF-ALIGNED METHOD FOR FORMING POLYSILICON WORD LINES ON TOP OF GATE ELECTRODES TO INCREASE CAPACITANCE OF A STACKED CAPACITOR IN A DRAM CELL

BACKGROUND OF THE INVENTION (1) Field of the Invention

The present invention relates to a method of fabricating a dynamic random access memory (DRAM) having an increased capacitance capacitor using a self-aligned method to increase capacitor area.

(2) Description of the Prior Art

In recent years there has been a dramatic increase in the packing density of DRAMs. Large DRAM devices are normally silicon based, and each cell typically embodies a single MOS field effect transistor with its source connected to a storage capacitor. This large integration of DRAMs has been accomplished by a reduction in individual cell size. However, the reduction in cell size results in a decrease in storage capacitance leading to reliability drawbacks, such as a lowering source/drain ratio and undesirable signal problems. In order to achieve the desired higher level of integration, the technology must keep almost the same storage capacitance on a greatly reduced cell area.

Efforts to maintain or increase the storage capacitance in memory cells with greater packing densities have included the use of a stacked capacitor design in which the capacitor cell uses the space over the device area for the capacitor plates. In their U.S. Pat. No. 5,140,389 to Kimura et al, the inventors describe various embodiments of stacked capacitors. U.S. Pat. Nos. 5,059,548 to Kim and 5,146,300 to Hamamoto et al show stacked capacitor processes and resulting structures. U.S. Pat. No. 5,047,817 to Wakamiya et al describes etching the lower electrode area of the capacitor into various concave/convex shapes in order to increase the surface area and capacitance of the capacitor.

A typical stacked capacitor of the prior art is illustrated in FIG. 1. Device structures are shown in and on a semiconductor substrate 10. Field oxide regions 11 isolate device regions. Gate electrodes 14 are shown overlying gate oxide layer 12. The bottom node of the capacitor 32 is shown contacting the capacitor node contact region 28. Completing the capacitor are the dielectric layer 34 and top electrode layer 36. A thick insulating layer 38 covers the capacitor and device structures. A conducting layer 40 completes connection to the bit line contact region 29.

SUMMARY OF THE INVENTION

Accordingly, it is a primary object of the invention to provide an improved and very manufacturable process for producing a memory cell capacitor with increased capacitance.

Another object of the present invention is to provide a method for increasing the capacitance of a memory cell capacitor by increasing the surface area of the capacitor.

Yet another object of the invention is to provide a self-aligned method for increasing the surface area of the capacitor.

A method is described for forming a dynamic random access memory cell capacitor in which polysilicon word lines are formed in a self-aligned method on top of the gate electrodes of the memory cell wherein the polysilicon word lines act to increase the surface area and hence to increase the capacitance of the capacitor. A gate silicon oxide layer, a first polysilicon layer, a first silicon oxide layer, and a second polysilicon layer are provided over the surface of a semiconductor substrate. A layer of silicon nitride is deposited overlying the second polysilicon layer. A second silicon oxide layer is deposited overlying the silicon nitride layer. Word lines of the second polysilicon layer are formed over the planned gate electrode areas by etching through the second silicon oxide, silicon nitride, and second polysilicon layers using a photoresist word line mask. The second polysilicon word lines will increase the area of the capacitor. Silicon nitride spacers are formed on the sidewalls of the second polysilicon word lines. Gate electrodes are formed by etching through the first silicon oxide and first polysilicon layers using the second polysilicon word lines with silicon nitride spacers as a mask. Source/drain regions are formed within the silicon substrate. Silicon oxide spacers are grown on the sidewalls of the gate electrodes. The silicon nitride layer and silicon nitride spacers are removed.

A via opening is etched through the gate oxide to one of the source/drain regions within the silicon substrate which will form the node of the capacitor. A third layer of polysilicon is deposited overlying the gate oxide and the first and second polysilicon layers and filling the via opening wherein the portion of the third polysilicon layer contacting the source/drain region which forms the node will be the bottom electrode of the capacitor. The third polysilicon layer is patterned. A capacitor dielectric layer is formed over the third polysilicon layer. A fourth polysilicon layer is deposited overlying the capacitor dielectric layer wherein the fourth polysilicon layer forms the top electrode of the capacitor. The area of the capacitor between the bottom and top electrodes is increased by the presence of the second polysilicon word lines.

A thick insulating layer is deposited over the surface of the substrate and flowed. Bit line contacts are opened through the thick insulating layer to the other of the source/drain regions within the silicon substrate. A bit line layer is deposited to complete the bit line contacts to the other source/drain region to complete formation of DRAM cell with capacitor.

BRIEF DESCRIPTION OF THE DRAWINGS

In the following drawings forming a material part of this description, there is shown:

FIG. 1 is a schematic cross-sectional representation of a prior art DRAM cell with capacitor.

FIGS. 2 through 6 are schematic cross-sectional representations of one preferred embodiment of the present invention.

DESCRIPTION OF THE PREFERRED EMBODIMENTS

Figure 6:
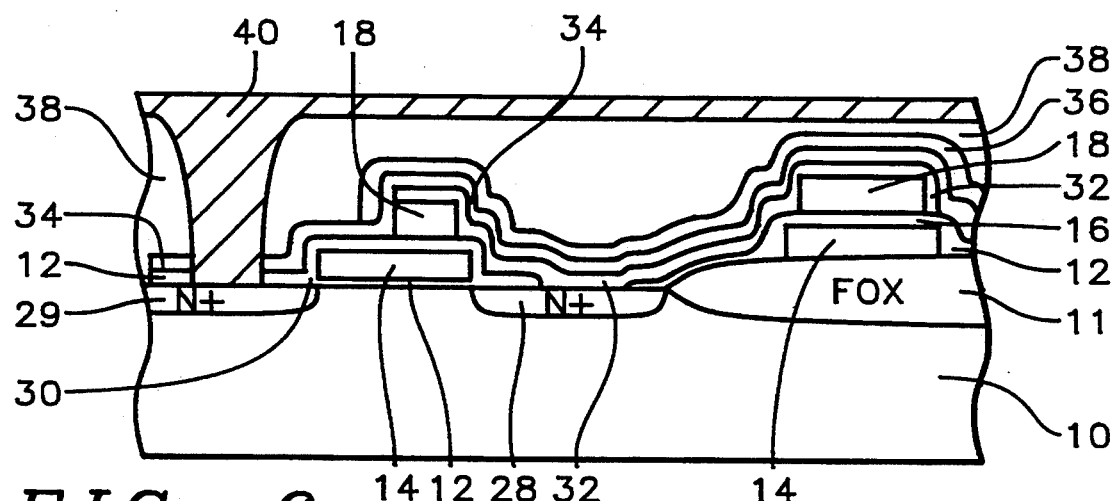

The first series of steps involve the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 11, as shown in FIG. 6. Then semiconductor devices can be provided in the silicon mesas according to the following processes.

Referring now more particularly to FIG. 2, the surface of the silicon substrate 10 is thermally oxidized to form the desired gate oxide 12 thickness. The preferred thickness is between about 60 to 150 Angstroms. The polysilicon layer 14 is blanket deposited by low pressure chemical vapor deposition (LPCVD) to a preferred thickness of between about 2000 to 5000 Angstroms. The polysilicon layer 14 is doped with $POCL_3$ or by ion implantation of arsenic or phosphorus. A first layer of silicon oxide 16 is deposited by chemical vapor deposition (CVD) over the surface of the first polysilicon layer 14 to a thickness of between about 500 to 1500 Angstroms. A second layer of polysilicon 18 is deposited by LPCVD over the surface of silicon oxide layer 16 to a thickness of between about 3000 to 6000 Angstroms. A layer of silicon nitride 20 is deposited over the second polysilicon layer to a thickness of between about 500 to 1000 Angstroms followed by a second layer of silicon oxide 22 with a thickness of between about 500 to 1000 Angstroms. A photoresist layer 24 is deposited over the surface of the substrate, exposed and developed using a word line mask over the areas of the planned gate electrodes.

The layers 22, 20, and 18 are etched leaving word lines of second polysilicon, as shown in FIG. 3. A layer of silicon nitride 26 is deposited over the word lines to a depth of between about 500 to 2000 Angstroms. The silicon nitride layer 26 is anisotropically etched to form spacers on the sidewalls of the polysilicon word lines 18.

Figure 4:
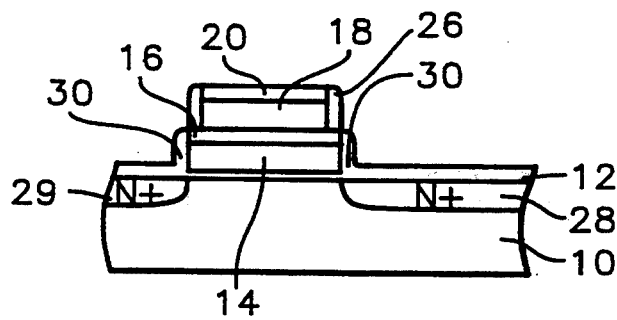

Referring now the FIG. 4, the polysilicon gate electrodes 14 are formed by a silicon oxide and polysilicon etch. The polysilicon word lines 18 with their silicon nitride spacers 26 act as a mask for this etch. The second silicon oxide layer 22 is removed also.

The source/drain structure of the MOS FET may now be formed by the following steps. FIG. 4 illustrates the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate. As is understood in the art, the DRAM cell is composed of a combination device structure of an N channel FET and a stacked capacitor while the peripheral circuits are often composed of CMOS devices.

The N+ source/drain ion implantation uses arsenic ions at a dosage of between about 1.0 to 8.0 atoms/cm$^2$ and energy of between about 50 to 100 Kev to complete the source/drain regions 28 and 29.

Silicon oxide spacers 30 are grown on the sidewalls of the polysilicon gate electrodes 14. These silicon oxide spacers have a thickness of between about 1000 to 2000 Angstroms.

The silicon nitride layer 20 and spacers 26 are removed using a nitride stripper such as phosphoric acid. Using conventional photolithography and etching techniques, a via opening is made through the gate silicon oxide layer 12 to the source region 28 within the silicon substrate which will form the capacitor node contact.

Figure 5:
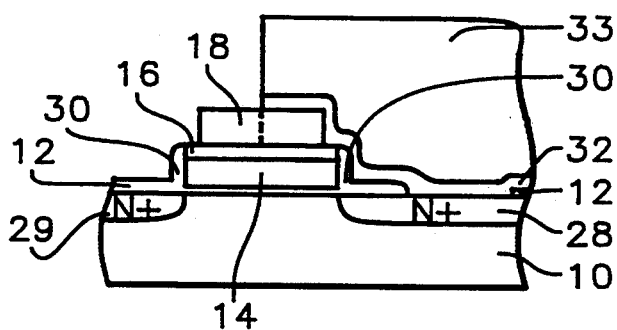

Referring now to FIG. 5, a third layer of polysilicon 32 is deposited over the surface of the substrate, over the polysilicon word lines 18 and within the via opening. This layer is deposited to a thickness of between about 500 to 4000 Angstroms. The surface area of this layer 32 is increased by the presence of the vertical sidewalled polysilicon word lines 18. The polysilicon layer 32 is doped by arsenic implantation or $POCL_3$ and patterned to form the bottom node of the capacitor. FIG. 5 shows the location of the pattern edge of 32 using photoresist mask 33. Since the polysilicon layers 18 and 32 are shorted; that is, merged together, the bottom node etching must also etch away the polysilicon line 18 in accordance with the layout of the bottom capacitor. We show this etch by dashed line in FIG. 5. Note that in FIG. 6 a portion of the polysilicon layer 18 has been etched away.

Referring now to FIG. 6, the capacitor dielectric layer 34 is now formed over all surfaces of the substrate. The layer is typically composed of layers of silicon nitride and silicon oxide (NO). In making the NO dielectric, the silicon nitride N layer is formed by LPCVD to give a resulting thickness of between about 40 to 70 Angstroms. The top silicon oxide, O layer may be formed by thermal oxidation or a chemical vapor deposition (CVD) method. The total effective NO thickness is on the order of 40 to 100 Angstroms.

The top plate electrode is formed by depositing a fourth polysilicon layer 36 by LPCVD. The thickness of this layer 36 is between about 500 to 2000 Angstroms. It is doped with $POCL_3$ or by ion implantation. This layer is patterned using conventional lithography and etching techniques to complete construction of the capacitor.

The following steps illustrate the electrical connections to the FET and the capacitor cell of the DRAM integrated circuit. A thick insulating layer 38 is blanket deposited over the wafer. This insulating layer is typically composed borophosphosilicate glass (BPSG) or BPSG and tetraethoxysilane (TEOS) with a thickness of between about 3000 to 10,000 Angstroms. The glasseous layer is flowed at between about 700° to 900° C. in a $N_2$, $O_2$, or $H_2O$ ambient.

A contact opening is made through the thick insulating layer 38 and through the layers 34 and 12 to the bit line contact drain region 29. A conducting layer 40 is deposited over the surface of insulating layer 38 and within the contact opening to complete the electrical connections.

Figure 7:
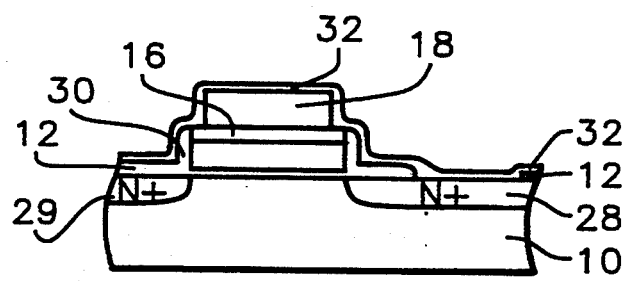
FIGS. 7 and 8 are schematic cross-sectional representations of a second preferred embodiment of the present invention.
Figure 8:
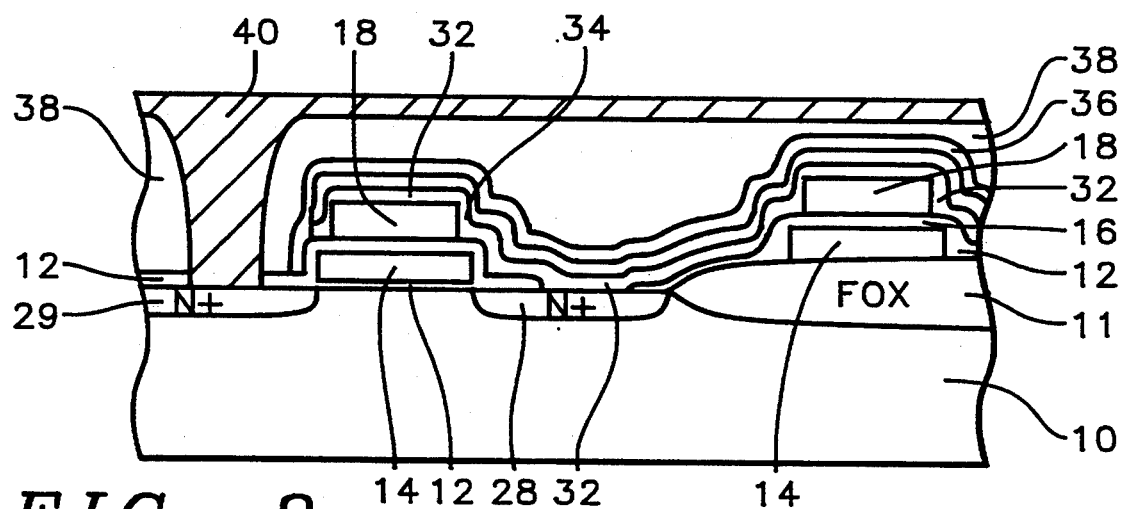

In a second preferred embodiment of the invention, the polysilicon layers 18 and 32 are shorted, as shown in the first embodiment in FIG. 5. However, in this embodiment, as illustrated in FIG. 7, the bottom electrode layer 32 is patterned to cover the entire word line 18 rather than only a portion of it as in FIG. 5. In this embodiment, the polysilicon word line 18 is not etched partially away, as shown in FIG. 8. Also, in this embodiment, it can be seen that the capacitor dielectric layer 34 ends at the gate electrode 14 border rather than continuing further. Processing continues as in the first embodiment to complete the formation of the DRAM cell with capacitor.

The capacitance of the capacitor of the present invention is increased by the additional surface area provided for the capacitor electrodes by the polysilicon vertical sidewall word line areas on top of the gate electrodes. These polysilicon vertical sidewall areas are formed along with the gate electrodes in a self-aligning process.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a dynamic random access memory (DRAM) having a capacitor comprising:
   providing a gate silicon oxide layer over the surface of a semiconductor substrate, a first polysilicon layer, a first silicon oxide layer, and a second polysilicon layer overlying said gate oxide layer;
   depositing a layer of silicon nitride overlying said second polysilicon layer;
   depositing a second silicon oxide layer overlying said silicon nitride layer;
   etching through said second silicon oxide, silicon nitride, and second polysilicon layers using a photoresist word line mask to form word lines of said second polysilicon wherein said second polysilicon word lines will increase the area of said capacitor;
   forming silicon nitride spacers on the sidewalls of said second polysilicon word lines;
   etching through said first silicon oxide and said first polysilicon layers using said second polysilicon word lines with said silicon nitride spacers as a mask to form gate electrodes;
   forming source and drain regions within said semiconductor substrate;
   forming silicon oxide spacers on the sidewalls of said gate electrodes;
   stripping said silicon nitride layer and said silicon nitride spacers;
   etching a via opening through said gate oxide to said source region within said semiconductor substrate which will form the node of said capacitor;
   depositing and etching a third layer of polysilicon overlying said gate oxide and said first and second polysilicon layers and filling said via opening wherein the portion of said third polysilicon layer contacting said source region which forms said node will be the bottom electrode of said capacitor;
   forming a capacitor dielectric layer over said third polysilicon layer;
   depositing a fourth polysilicon layer overlying said capacitor dielectric layer wherein said fourth polysilicon layer forms the top electrode of said capacitor wherein the area of said capacitor between said bottom and top electrodes is increased by the presence of said second polysilicon word lines;
   depositing an insulating layer over the surface of said substrate and flowing said insulating layer;
   opening bit line contacts through said insulating layer to said drain region within said semiconductor substrate; and
   depositing a bit line layer to complete said bit line contacts to said drain region to complete formation of said DRAM with capacitor.

2. The method of claim 1 wherein said first polysilicon layer has a thickness of between about 500 to 1500 Angstroms.

3. The method of claim 1 wherein said second polysilicon layer has a thickness of between about 3000 to 6000 Angstroms.

4. The method of claim 1 wherein said silicon nitride spacers are formed by depositing a layer of silicon nitride overlying said second polysilicon layer to a thickness of between about 500 to 2000 Angstroms and etching said silicon nitride layer anisotropically to leave said spacers on the sidewalls of said second polysilicon word lines.

5. The method of claim 1 wherein said source/drain regions have N+ regions formed therein by ion implanting arsenic at a dosage of between 1.0 to 8.0 atoms/cm$^2$ and energy of 50 to 100 Kev.

6. The method of claim 1 wherein said silicon oxide spacers are formed by growing a layer of silicon oxide to a thickness of between about 1000 to 2000 Angstroms on the sidewalls of said first polysilicon gate electrodes.

7. The method of claim 1 wherein said third polysilicon layer is deposited to a depth of between about 500 to 4000 Angstroms.

8. The method of claim 1 wherein said capacitor dielectric layer is composed of layers of silicon nitride and silicon oxide.

9. The method of claim 1 wherein said fourth polysilicon layer has a thickness of between about 500 and 2000 Angstroms.

10. The method of claim 1 wherein said insulating layer is composed of borophosphosilicate glass to a thickness of between about 3000 to 10,000 Angstroms.

11. The method of claim 1 wherein said insulating layer is composed of borophosphosilicate glass and TEOS oxide to a thickness of between about 3000 to 10,000 Angstroms.

12. A method for fabricating a dynamic random access memory having a capacitor comprising:
    selectively forming field oxide areas on the surface of a semiconductor substrate while leaving device areas for fabrication of semiconductor devices;
    forming device structures within said device areas of said semiconductor substrate wherein said device structures include a capacitor node contact region within said semiconductor substrate and polysilicon word lines on the surface of said semiconductor substrate wherein a polysilicon vertical sidewall area is formed over said word lines by a self-aligning method whereby the capacitance of said capacitor will be increased and wherein said self-aligning method comprises:
    depositing a first layer of polysilicon over a gate oxide layer on the surface of said semiconductor substrate;
    depositing a first silicon oxide layer over said first polysilicon layer;
    depositing a second polysilicon layer over said first silicon oxide layer;
    depositing a silicon nitride layer over said second polysilicon layer;
    depositing a second silicon oxide layer over said silicon nitride layer;
    etching through said second silicon oxide, silicon nitride, and second polysilicon layers using a photoresist word line mask;
    forming silicon nitride spacers on the sidewalls of said patterned second polysilicon layer;

etching through said first silicon oxide and said first polysilicon layers using said patterned second polysilicon layer and said silicon nitride sidewalls as a mask;

forming silicon oxide spacers on the sidewalls of said patterned first polysilicon layer completing formation of said polysilicon word lines; and stripping said silicon nitride layer and said silicon nitride sidewalls from said patterned second polysilicon layer completing formation of said polysilicon vertical sidewall areas overlying said polysilicon word lines; and forming said capacitor by:

opening a contact between said device structures to said capacitor node contact region;

depositing a third layer of polysilicon overlying said device structures and filling said contact opening wherein the surface area of said third layer of polysilicon is increased by the presence of said vertical sidewalled polysilicon layer overlying said polysilicon word lines;

doping and patterning said third polysilicon layer to form the bottom node of said capacitor;

depositing a capacitor dielectric layer overlying said third polysilicon layer;

depositing a fourth layer polysilicon overlying said capacitor dielectric layer wherein said fourth polysilicon layer forms the top electrode of said capacitor;

depositing an insulating layer over the surface of said substrate and flowing said insulating layer;

opening contacts through said insulating layer to said device structures within said semiconductor substrate; and depositing a conducting layer over said insulating layer and within said contact openings to complete formation of said DRAM with capacitor.

13. The method of claim 12 wherein said device structures in said device areas are source/drain and gate field effect transistor structures which form a dynamic random access memory cell together with said capacitor.

14. The method of claim 12 wherein said polysilicon word lines form gate field effect transistor structures.

15. The method of claim 12 wherein said first polysilicon layer has a thickness of between about 2000 to 5000 Angstroms.

16. The method of claim 12 wherein said second polysilicon layer has a thickness of between about 3000 to 6000 Angstroms.

17. The method of claim 12 wherein said silicon nitride spacers are formed by depositing a layer of silicon nitride overlying said second polysilicon layer to a thickness of between about 500 to 2000 Angstroms and etching said silicon nitride layer anisotropically to leave said spacers on the sidewalls of said patterned second polysilicon layer.

18. The method of claim 12 wherein said silicon oxide spacers are formed by growing a layer of silicon oxide to a thickness of between about 1000 to 2000 Angstroms on the sidewalls of said patterned first polysilicon layer.

19. The method of claim 12 wherein the thickness of said third polysilicon layer is between about 500 to 4000 Angstroms.

20. The method of claim 12 wherein the thickness of said fourth polysilicon layer is between about 500 to 2000 Angstroms.

21. The method of claim 12 wherein said capacitor dielectric is composed of layers of silicon nitride and silicon oxide.

22. The method of claim 12 wherein said insulating layer is composed of borophosphosilicate glass to a thickness of between about 3000 to 10,000 Angstroms.

23. The method of claim 12 wherein said insulating layer is composed of borophosphosilicate glass and TEOS oxide to a thickness of between about 3000 to 10,000 Angstroms.

* * * * *